US006933493B2

(12) United States Patent
Hsin

(10) Patent No.: US 6,933,493 B2
(45) Date of Patent: Aug. 23, 2005

(54) IMAGE SENSOR HAVING A PHOTOSENSITIVE CHIP MOUNTED TO A METAL SHEET

(75) Inventor: Chung Hsien Hsin, Hsinchu Hsien (TW)

(73) Assignee: Kingpak Technology Inc., Hsinchu Hsien (TW)

( * ) Notice: Subject to any disclaimer, the term of this patent is extended or adjusted under 35 U.S.C. 154(b) by 191 days.

(21) Appl. No.: 10/409,253

(22) Filed: Apr. 7, 2003

(65) Prior Publication Data

US 2004/0195492 A1 Oct. 7, 2004

(51) Int. Cl.[7] .......................... H01J 40/14; H01J 5/02

(52) U.S. Cl. .......................... 250/239; 250/214 R

(58) Field of Search .................... 257/81, 82, 432–434, 257/680, 681, 690, 784; 250/239, 214.1, 208.1, 214 R

(56) References Cited

U.S. PATENT DOCUMENTS 5,122,861 A * 6/1992 Tamura et al. .............. 257/434
6,262,489 B1 * 7/2001 Koors et al. ................ 257/784
6,396,116 B1 * 5/2002 Kelly et al. ................. 257/432
6,583,444 B2 * 6/2003 Fjelstad ....................... 257/82
6,586,824 B1 * 7/2003 Glenn et al. ................ 257/680
6,590,269 B1 * 7/2003 Chuang et al. ............. 257/432
6,649,834 B1 * 11/2003 Hsieh et al. ............... 174/52.4
6,680,525 B1 * 1/2004 Hsieh et al. ................ 257/680
6,696,738 B1 * 2/2004 Tu et al. ..................... 257/433
6,713,876 B1 * 3/2004 Vittu et al. ................. 257/777
6,740,973 B1 * 5/2004 Hsin .......................... 257/749
6,747,261 B1 * 6/2004 Hsieh et al. ............. 250/208.1
2002/0079438 A1 * 6/2002 Lin ........................... 250/239
2003/0193018 A1 * 10/2003 Tao et al. ................... 250/239
2004/0113049 A1 * 6/2004 Hsieh et al. ............. 250/208.1
2004/0113221 A1 * 6/2004 Hsieh et al. ................ 257/433

* cited by examiner

*Primary Examiner*—David Porta
*Assistant Examiner*—Davienne Monbleau
(74) *Attorney, Agent, or Firm*—Pro-Techtor International Services

(57) ABSTRACT

An image sensor includes a substrate, a metal sheet, a photosensitive chip, a plurality of wires, and a transparent layer. The substrate has a slot. The metal sheet is attached to the lower surface of the substrate and located under the slot to form a cavity together with the slot. The photosensitive chip is arranged within the cavity and mounted to the metal sheet. The wires electrically connect the photosensitive chip to the substrate. The transparent layer is arranged on the substrate to cover the photosensitive chip. Thus, the photosensitive chip may receive optical signals passing through the transparent layer.

4 Claims, 1 Drawing Sheet

IMAGE SENSOR HAVING A PHOTOSENSITIVE CHIP MOUNTED TO A METAL SHEET

BACKGROUND OF THE INVENTION

1. Field of the Invention

The invention relates to an image sensor, and in particular to an image sensor having improved radiation effects and arced wires with greater radii of curvature.

2. Description of the Related Art

A general sensor is used to sense signals, which may be optical or audio signals. The sensor of the invention is used to receive image signals or optical signals. After receiving the image signals, the sensor converts the image signals into electrical signals, which are then transmitted to a printed circuit board via a substrate.

Referring to FIG. 1, a conventional image sensor includes a substrate 10, a frame layer 18, a photosensitive chip 26, a plurality of wires 28, and a transparent layer 34. The substrate 10 has a first surface 12 on which a plurality of signal input terminals 15 are formed, and a second surface 14 on which a plurality of signal output terminals 16 are formed. The frame layer 18 has an upper surface 20 and a lower surface 22 adhered to the first surface 12 of the substrate 10 to form a cavity 24 together with the substrate 10. The photosensitive chip 26 is arranged within the cavity 24 and is mounted to the first surface 12 of the substrate 10. Each wire 28 has a first terminal 30 and a second terminal 32. The first terminals 30 are electrically connected to the photosensitive chip 26, and the second terminals 32 are electrically connected to the signal input terminals 15 of the substrate 10. The transparent layer 34 is adhered to the upper surface 20 of the frame layer 18.

However, the above-mentioned image sensor has the following drawbacks.

1. Since the substrate 10 is a ceramic substrate or FR4 printed circuit board on which traces are formed to form the signal input terminals 15 and signal output terminals 16, the overall volume of the substrate 10 is large, the material cost is high, and the package cost is relatively high.

2. Since a gap for wire bonding has to be left between the substrate 10 and the frame layer 18, the package volume is large and the product cannot be miniaturized.

3. Arranging the photosensitive chip 26 on the substrate 10 may have poor radiation effects.

4. Since the wires 28 are bonded to the substrate 10, the radii of curvature of the arced wires may be increased, and the throughput is small.

SUMMARY OF THE INVENTION

An object of the invention is to provide an image sensor having reduced quantity of material and reduced manufacturing cost.

Another object of the invention is to provide an image sensor having a reduced and miniaturized package volume.

Still another object of the invention is to provide an image sensor having improved radiation effects and product quality.

Yet still another object of the invention is to provide an image sensor having arced wires with greater radii of curvature so that the throughput may be increased.

To achieve the above-mentioned objects, the invention provides an image sensor. The image sensor includes a substrate, a metal sheet, a photosensitive chip, a plurality of wires, and a transparent layer. The substrate is formed with a slot. The metal sheet is attached to the lower surface of the substrate and located under the slot of the substrate to form a cavity together with the slot of the substrate. The photosensitive chip is arranged within the cavity and is mounted to the metal sheet. The wires electrically connect the photosensitive chip to the substrate. The transparent layer is placed on the substrate to cover the photosensitive chip so that the photosensitive chip may receive optical signals passing through the transparent layer.

DETAILED DESCRIPTION OF THE INVENTION

Figure 1:
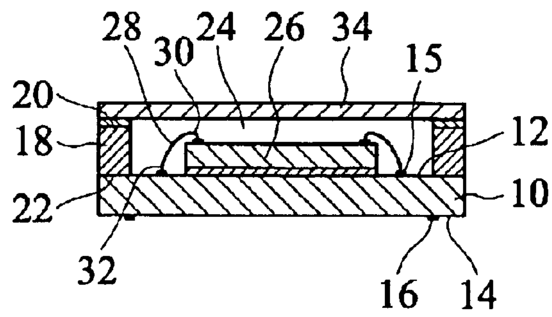
FIG. 1 is a cross-sectional view showing a conventional image sensor.
Figure 2:
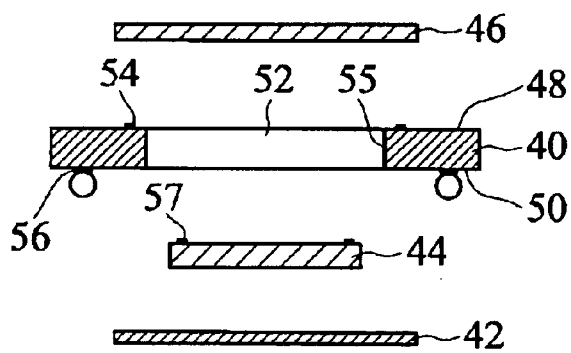
FIG. 2 is an exploded, cross-sectional view showing an image sensor of the invention.
Figure 3:
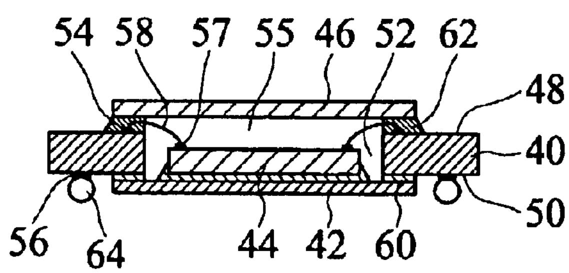
FIG. 3 is a cross-sectional view showing the image sensor of the invention.

Referring to FIGS. 2 and 3, an image sensor of the invention includes a substrate 40, a metal sheet 42, a photosensitive chip 44, a plurality of wires 58, and a transparent layer 46.

The substrate 40 has a frame-shaped structure, which has an upper surface 48 on which a plurality of first connection points 54 is formed, a lower surface 50 on which a plurality of second connection points 56 electrically connected to the first connection points 54 is formed, and a slot 52 penetrating through the substrate 40 from the upper surface 48 to the lower surface 50.

The metal sheet 42 is attached to the lower surface 50 of the substrate 40 and is located under the slot 52 of the substrate 40 to form a cavity 55 together with the slot 52 of the substrate 40.

The photosensitive chip 44 is formed with a plurality of bonding pads 57, arranged within the cavity 55, and mounted to the metal sheet 42.

The wires 58 electrically connect the bonding pads 57 of the photosensitive chip 44 to the first connection points 54 of the upper surface 48 of the substrate 40, respectively.

The transparent layer 46 is a piece of transparent glass and is placed on the upper surface 48 of the substrate 40 to cover the photosensitive chip 44. Thus, the photosensitive chip 44 may receive optical signals through the transparent layer 46.

Referring to FIG. 3, the method for packaging the image sensor includes the following steps. First, the metal sheet 42 is adhered to the lower surface 50 of the substrate 40 by an adhesive 60 to form the cavity 55 together with the substrate 40. Then, the photosensitive chip 44 is arranged within the cavity 55 and mounted to the metal sheet 42. Next, the wires 58 are provided to electrically connect the bonding pads 57 of the photosensitive chip 44 to the first connection points 54 formed on the upper surface 48 of the substrate 40, respectively. Then, an encapsulant 62 is applied or coated to the upper surface 48 of the substrate 40 to encapsulate the wires 58. The transparent layer 46 is adhered to the upper surface 48 of the substrate 40 by the encapsulant 62 in order to cover the photosensitive chip 44. Thus, the photosensitive chip 44 may receive optical signals passing through the transparent layer 46. Finally, it is possible to form BGA metal balls 64 on the second connection points 56 of the lower surface 50 of the substrate 40, respectively. Then, the image sensor is thus completed.

The image sensor of the invention has the following advantages.

1. Since traces are formed on the substrate 40 to form the first connection points 54 and second connection points 56, the used ceramic or FR4 printed circuit board may be reduced. In addition, since the photosensitive chip 44 is mounted to the metal sheet 42 having a larger area, the package cost may be effectively reduced.

2. Since the wires 58 are bonded to the upper surface 48 of the substrate 40, the gap between the substrate 40 and the photosensitive chip 44 may be reduced, and the package volume of the image sensor may be effectively miniaturized.

3. Directly mounting the photosensitive chip 44 to the metal sheet 42 may improve the radiation effects.

4. Since the wires 58 are bonded to the upper surface of the substrate 40, the radii of curvature of the arced wires may be effectively increased, and the throughput may be improved accordingly.

While the invention has been described by way of an example and in terms of a preferred embodiment, it is to be understood that the invention is not limited to the disclosed embodiment. To the contrary, it is intended to cover various modifications. Therefore, the scope of the appended claims should be accorded the broadest interpretation so as to encompass all such modifications.

What is claimed is:

1. An image sensor, comprising:

a substrate having an upper surface, a lower surface, and a slot penetrating through the substrate from the upper surface to the lower surface, the upper surface being formed with a plurality of first connection points, and the lower surface being formed with a plurality of second connection points;

a metal sheet attached to the lower surface of the substrate and located under the slot of the substrate to form a cavity together with the slot of the substrate;

a photosensitive chip formed with a plurality of bonding pads, the photosensitive chip being arranged within the cavity and mounted to the metal sheet;

a plurality of wires for electrically connecting the bonding pads of the photosensitive chip to the first connection points of the upper surface of the substrate; and a transparent layer arranged on the upper surface of the substrate to cover the photosensitive chip so that the photosensitive chip may receive optical signals passing through the transparent layer.

2. The image sensor according to claim 1, wherein metal sheet is adhered to the lower surface of the substrate by an adhesive.

3. The image sensor according to claim 1, wherein the transparent layer is a piece of transparent glass.

4. The image sensor according to claim 1, wherein the upper surface of the substrate is coated with an encapsulant to encapsulate the wires and adhere the transparent layer to the upper surface of the substrate.

* * * * *